United States Patent
Hayashi et al.

(10) Patent No.: US 9,170,281 B2
(45) Date of Patent: Oct. 27, 2015

(54) CURRENT MEASUREMENT APPARATUS HAVING A SERIES OF MAGNETORESISTIVE EFFECT ELEMENTS DISPOSED IN A RING SHAPE

(75) Inventors: Nobuhiro Hayashi, Niigata-ken (JP); Tatsuya Kogure, Niigata-ken (JP); Akira Takahashi, Niigita-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 576 days.

(21) Appl. No.: 13/608,563

(22) Filed: Sep. 10, 2012

(65) Prior Publication Data

US 2012/0326703 A1 Dec. 27, 2012

Related U.S. Application Data

(63) Continuation of application No. PCT/JP2011/052662, filed on Feb. 8, 2011.

(30) Foreign Application Priority Data

Mar. 12, 2010 (JP) .................................. 2010-056152

(51) Int. Cl.
*G01R 19/00* (2006.01)
*G01R 15/20* (2006.01)
*B82Y 25/00* (2011.01)
*G01R 33/09* (2006.01)

(52) U.S. Cl.
CPC ............... *G01R 15/205* (2013.01); *B82Y 25/00* (2013.01); *G01R 33/093* (2013.01)

(58) Field of Classification Search
CPC .... G01R 33/093; G01R 15/205; G01R 33/09; G01R 33/0052; G01R 33/0011; G01R 33/091; G01R 33/12; G01R 35/00; G01R 19/16571; G01R 22/06; G01R 31/026; G01R 33/0005; G01R 19/0092; G11B 2005/3996; G11B 5/39; G11B 5/3929; G11B 5/3909; G11B 5/3903; G11B 2005/0002; G11B 5/3983; G11B 5/66; G11B 5/312; G11C 11/15; G11C 11/5607; G11C 11/161; G11C 29/846; G11C 14/0081; G11C 19/0866; H01L 43/08; H01L 27/228; H01L 27/224; H01L 27/226; H01L 43/06; G01D 5/145

See application file for complete search history.

(56) References Cited

U.S. PATENT DOCUMENTS 5,049,809 A 9/1991 Wakatsuki et al.
5,708,407 A 1/1998 Mouchot et al.
(Continued)

FOREIGN PATENT DOCUMENTS

| JP | 10-300795 | 11/1998 |
|---|---|---|
| JP | 11-237411 | 8/1999 |
| JP | 2007-107972 | 4/2007 |

OTHER PUBLICATIONS

Search Report dated May 10, 2011 from International Application No. PCT/JP2011/052662.

*Primary Examiner* — Vinh Nguyen
(74) *Attorney, Agent, or Firm* — Beyer Law Group LLP

(57) ABSTRACT

A current measurement apparatus includes multiple GMR elements and a calculation unit. The multiple GMR elements each include a pinned magnetic layer having a pinned magnetization direction, and a free magnetic layer having a magnetization direction to be changed by an external magnetic field. The calculation unit obtains the magnitude of a current to be detected, from outputs of the multiple GMR elements. The multiple GMR elements are disposed in ring shape around a conductor through which the current to be detected flows, and are electrically connected so as to form a series variable resistor by using the multiple GMR elements. The magnetization directions of the pinned magnetic layers are pinned in the same direction when viewed from an extension direction of the conductor at each of the positions of the elements.

9 Claims, 10 Drawing Sheets

(56) References Cited

U.S. PATENT DOCUMENTS

| | | | |
|---|---|---|---|
| 6,101,071 A * | 8/2000 | Kouchiyama | 360/324 |
| 2002/0027752 A1 * | 3/2002 | Nakatani | 360/324.2 |
| 2004/0052006 A1 * | 3/2004 | Odagawa et al. | 360/324.1 |
| 2004/0188734 A1 * | 9/2004 | Tsang | 257/295 |
| 2006/0012459 A1 | 1/2006 | Lenssen | |
| 2007/0001675 A1 * | 1/2007 | Kurome et al. | 324/318 |
| 2009/0001980 A1 * | 1/2009 | Geren et al. | 324/252 |

* cited by examiner

CURRENT MEASUREMENT APPARATUS HAVING A SERIES OF MAGNETORESISTIVE EFFECT ELEMENTS DISPOSED IN A RING SHAPE

CLAIM OF PRIORITY

This application is a Continuation of International Application No. PCT/JP2011/052662 filed on Feb. 8, 2011, which claims benefit of Japanese Patent Application No. 2010-056152 filed on Mar. 12, 2010. The entire contents of each application noted above are hereby incorporated by reference.

BACKGROUND OF THE INVENTION

1. Field of the Invention

The present invention relates to current measurement apparatuses which measure the magnitude of a current which is to be detected and which flows through a conductor, and particularly to a current measurement apparatus which detects the magnitude of a current to be detected, via a change in magnetic resistance.

2. Description of the Related Art

Recently, in the field of, for example, electric cars or solar batteries, as electric cars or solar batteries have come to be of higher power and higher performance, a current value used therein has become larger. Accordingly, current sensors that measure a large direct current in a noncontact manner have been widely used. As one of such current sensors, a current sensor has been proposed which includes Hall elements that detect the magnitude of a current flowing through a conductor, via a magnetic field that occurs around the conductor (for example, see Japanese Unexamined Patent Application Publication No. 2007-107972).

This current sensor includes a semiconductor substrate having an opening, and multiple Hall elements that are disposed on the semiconductor substrate and that output Hall voltage signals on the basis of a change in a magnetic field. A current line through which a current to be detected flows is disposed orthogonally to the semiconductor substrate so as to pass through the opening of the semiconductor substrate. The Hall elements are disposed in a circle, the center of which is located on the current line. The current sensor described in Japanese Unexamined Patent Application Publication No. 2007-107972 detects the magnitude of a current to be detected, by using the Hall voltage signals that are output from the Hall elements on the basis of a change in a magnetic field which occurs around the current line when the current to be detected flows through the current line.

SUMMARY OF THE INVENTION

However, the current sensor described in Japanese Unexamined Patent Application Publication No. 2007-107972 uses Hall elements, resulting in a problem in that the detection direction is limited. In addition, it is necessary to provide a detection circuit for each of the Hall elements, and it is further necessary to provide an adding circuit that adds output signals from the detection circuits, resulting in a problem in that a reduction in the size of the current sensor is limited. Further, there arises a problem in that variations in the position (distance) of the current line with respect to the current sensor are reflected in variations in the measurement value.

The present invention has been made in view of the above-described problems, and provides a current measurement apparatus which can detect a current to be detected, with high sensitivity and high accuracy and which enables simplification of a configuration and a reduction in size.

A current measurement apparatus of the present invention includes multiple magnetoresistive effect elements and a calculation means. The magnetoresistive effect elements each include a pinned magnetic layer having a pinned magnetization direction, and a free magnetic layer having a magnetization direction to be changed by an external magnetic field. The calculation means obtains the magnitude of a current to be detected, from outputs of the magnetoresistive effect elements. The magnetoresistive effect elements are disposed in ring shape around a conductor through which the current to be detected flows, and are electrically connected so as to form a series variable resistor by using the magnetoresistive effect elements. The magnetization directions of the pinned magnetic layers are pinned in the same direction when viewed from an extension direction of the conductor at each of the positions of the elements.

According to this configuration, the multiple magnetoresistive effect elements form a series variable resistor. The use of the multiple magnetoresistive effect elements as a variable resistor enables a change in the magnetic resistance of each of the magnetoresistive effect elements to be detected without an adding circuit, enabling simplification of an apparatus configuration and a reduction in size. In addition, by disposing the magnetoresistive effect elements in ring shape around the conductor, a magnetic field that occurs when a current to be detected flows through the conductor can be detected as a change in magnetic resistance which corresponds to a magnetization angle between the magnetization direction in the pinned magnetic layer and that in the free magnetic layer.

In the current measurement apparatus described above, in the magnetoresistive effect elements, the magnetization directions of the pinned magnetic layers may be pinned in a ring-shaped direction in which the magnetoresistive effect elements are in a line with one another in ring.

Alternatively, in the current measurement apparatus described above, in the magnetoresistive effect elements, the magnetization directions of the pinned magnetic layers may be pinned toward a center portion of the conductor.

Alternatively, in the current measurement apparatus described above, in the magnetoresistive effect elements, the magnetization directions of the pinned magnetic layers may be pinned in radial directions from a center portion of the conductor.

In these configurations, a magnetic field that occurs around the conductor causes the magnetization directions in the free magnetic layers to be changed to substantially the same direction with respect to the magnetization directions in the pinned magnetic layers. Accordingly, a sensitivity difference between the magnetoresistive effect elements can be reduced, improving the detection accuracy of the current measurement apparatus.

In the current measurement apparatus described above, the magnetoresistive effect elements may be provided on a common conductive body.

In the current measurement apparatus described above, the magnetoresistive effect elements may be formed on an elastic body, and the elastic body may be deformed and disposed so as to surround the conductor.

In the current measurement apparatus described above, the magnetoresistive effect elements may be provided with a conductive layer disposed on the free magnetic layer with an insulating layer interposed therebetween, and a current that has flowed through the magnetoresistive effect elements may flow back through the conductive layer in the opposite direction.

According to the configuration, by passing a current that has flowed through the magnetoresistive effect elements, through the conductive layer in the opposite direction, a magnetic field can be generated in the direction opposite to that of a magnetic field that occurs when the current flows through the magnetoresistive effect elements. Thus, a change in the magnetization direction in the free magnetic layer which is caused by the magnetic field that occurs when the current flows through the magnetoresistive effect elements can be reduced, improving the detectivity and the detection accuracy of the current measurement apparatus.

DESCRIPTION OF THE PREFERRED EMBODIMENTS

Hereinafter, embodiments of the present invention will be described in detail with reference to the accompanying drawings.

First embodiment

Figure 1:
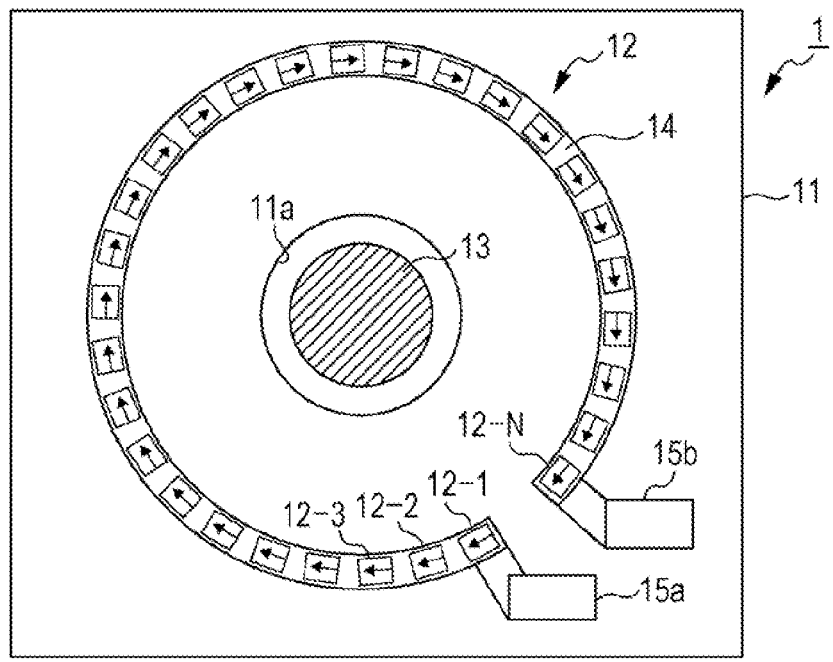
FIG. 1 is a plan view illustrating a current measurement apparatus according to a first embodiment of the present invention.

FIG. 1 is a plan view illustrating a current measurement apparatus according to a first embodiment of the present invention. As illustrated in FIG. 1, a current measurement apparatus 1 includes a substrate 11 having a substantially circular-shaped center aperture 11a, multiple giant magneto resistance (GMR) elements 12-1 to 12-N disposed in ring shape in an outer periphery of the center aperture 11a of the substrate 11, and a calculation unit (not illustrated) for obtaining the magnitude of a current to be detected, from outputs of the GMR elements 12-1 to 12-N. A conductor 13 is formed of a linear object having a substantially circular shape in section view, and is disposed so as to pass through the center aperture 11a of the substrate 11. The current to be detected flows through the conductor 13.

The GMR elements 12-1 to 12-N are continuously disposed with conductive bodies 14, each of which is interposed between each adjacent pair of the elements, and constitute a GMR element line 12 in which the multiple GMR elements 12-1 to 12-N are electrically connected in series as a whole. The GMR elements 12-1 to 12-N each include a pinned magnetic layer in which the magnetization direction is pinned, and a free magnetic layer in which the magnetization direction is to be changed by a magnetic field that occurs when a current to be detected flows through the conductor 13, so that a magnetic resistance is changed in accordance with a magnetization angle between the magnetization direction in the pinned magnetic layer and that in the free magnetic layer. That is, according to the embodiment, the multiple GMR elements 12-1 to 12-N are disposed in ring shape so as to surround the conductor 13, so that a change in a magnetic field that occurs when a current to be detected flows through the conductor 13 can be detected by using the GMR elements 12-1 to 12-N via a change in the magnetization direction in the free magnetic layer.

According to the embodiment, the magnetization directions in the pinned magnetic layers of the GMR elements 12-1 to 12-N are pinned in a direction along the ring-shaped line along which the GMR elements 12-1 to 12-N are disposed (see the arrows in FIG. 1). Note that the GMR elements 12-1 to 12-N may be disposed in a shape other than a ring shape on the basis of the range in which the magnetization direction in the free magnetic layer is changed by a magnetic field that occurs when a current to be detected flows through the conductor 13.

Electrode pads 15a and 15b that electrically connect the GMR elements 12-1 to 12-N to the calculation unit (not illustrated) are provided on the substrate 11. The electrode pad 15a is connected to the GMR element 12-1 which is located on one end side of the GMR element line 12 disposed in ring shape, whereas the electrode pad 15b is connected to the GMR element 12-N which is located on the other end side. This configuration as described above allows the GMR element line 12 disposed in ring shape to form a series variable resistor.

Figure 2:
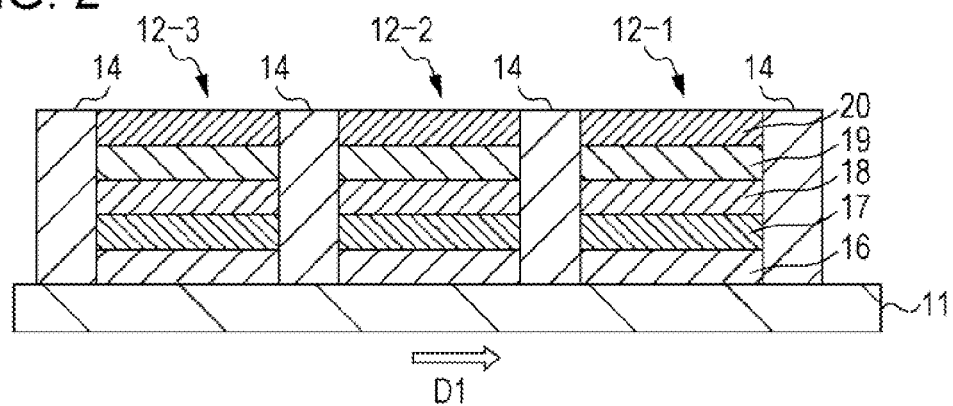
FIG. 2 is a diagram illustrating the layered structure of giant magneto resistance (GMR) elements in the current measurement apparatus according to the first embodiment of the present invention.

FIG. 2 is a diagram illustrating the layered structure of the GMR elements 12-1 to 12-N, and illustrates a portion of the layered structure for some of the GMR elements, the GMR elements 12-1 to 12-3. As illustrated in FIG. 2, the GMR elements 12-1 to 12-N each include a seed layer 16 provided on the substrate 11, an antiferromagnetic layer 17 provided on the seed layer 16, a pinned magnetic layer (pinned layer) 18 provided on the antiferromagnetic layer 17, a nonmagnetic layer 19 provided on the pinned magnetic layer 18, and a free magnetic layer 20 provided on the nonmagnetic layer 19. The conductive bodies 14 each are disposed between a corresponding one of adjacent pairs of the GMR elements 12-1 to 12-N. Note that a ground layer may be disposed between the substrate 11 and the seed layer 16 and that a protective layer may be disposed on the free magnetic layer 20.

In the GMR elements 12-1 to 12-N, the antiferromagnetic layer 17 and the pinned magnetic layer 18 are formed so as to be in contact with each other, whereby an exchange coupling magnetic field (Hex) occurs in an interface between the antiferromagnetic layer 17 and the pinned magnetic layer 18 by performing heat treatment in a magnetic field (hereinafter, referred to as annealing treatment). This exchange coupling magnetic field causes the magnetization direction in the pinned magnetic layer 18 to be pinned in one direction. In FIG. 2, the magnetization direction in the pinned magnetic layer 18 is pinned in the direction indicated by the arrow D1.

In contrast, the free magnetic layer 20 is stacked so as to oppose the pinned magnetic layer 18 with the nonmagnetic layer 19 interposed therebetween. Thus, the magnetization direction in the free magnetic layer 20 is not pinned in one direction, and is to be changed under the influence of an external magnetic field. The magnetization direction D1 in the pinned magnetic layer 18 can be adjusted to any direction depending on a condition of the annealing treatment, in a process of manufacturing the GMR element line 12 described below.

The seed layer 16 is formed from, for example, NiFeCr or Cr. The antiferromagnetic layer 17 is formed from an antiferromagnetic material containing Mn and at least one element selected from a group consisting of Pt, Pd, Ir, Rh, Ru, and Os, or from an antiferromagnetic material containing Mn, at least one element selected from a group consisting of Pt, Pd, Ir, Rh, Ru, and Os, and at least one element selected from a group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements. For example, the antiferromagnetic layer 17 is formed from IrMn or PtMn. The pinned magnetic layer 18 and the free magnetic layer 20 are formed from a magnetic material, such as a CoFe alloy, a NiFe alloy, or a CoFeNi alloy. The nonmagnetic layer 19 and the conductive body 14 are formed from, for example, Cu. When a ground layer is provided, the ground layer may be formed from a nonmagnetic material such as at least one element selected from a group consisting of, for example, Ta, Hf, Nb, Zr, Ti, Mo, and W. When a protective layer is provided, the protective layer may be formed from, for example, Ta.

Figure 3:
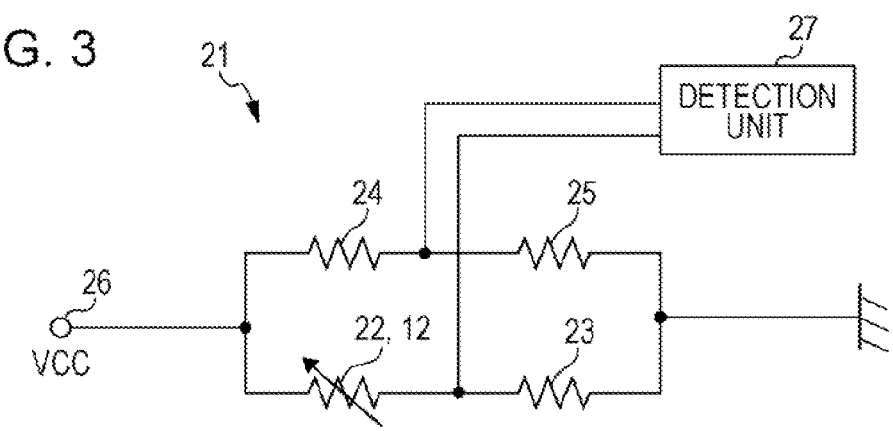
FIG. 3 is a circuit configuration diagram of a calculation unit in the current measurement apparatus according to the first embodiment of the present invention.

FIG. 3 is a circuit configuration diagram of a calculation unit 21 in the current measurement apparatus 1. As illustrated in FIG. 3, the calculation unit 21 of the current measurement apparatus 1 handles the entire GMR elements 12-1 to 12-N disposed in ring shape as a single variable resistor 22, and a bridge circuit is constituted by the variable resistor 22 and three fixed resistors 23, 24, and 25. A terminal 26 to which power supply voltage is applied is connected to the electrode pad 15a located on one end side of the GMR element line 12, whereas one end of the fixed resistor 23 is connected to the electrode pad 15b located on the other end side of the GMR element line 12. The other end of the fixed resistor 23 is grounded. One end of the fixed resistor 24 is connected to the terminal 26, and the other end of the fixed resistor 24 is connected to one end of the fixed resistor 25. The other end of the fixed resistor 25 is grounded. A detection unit 27 is connected between a connection point between the other pad, i.e., the electrode pad 15b, which is connected to the other end side of the GMR element line 12 and one end of the fixed resistor 23, and a connection point between the other end of the fixed resistor 24 and one end of the fixed resistor 25. The detection unit 27 compares a voltage value on the side of the fixed resistor 23 and the variable resistor 22 formed by the entire GMR elements 12-1 to 12-N, with a voltage value on the side of the fixed resistors 24 and 25.

The principle of detection performed by the current measurement apparatus 1 will be described with reference to FIGS. 4A to 4D. FIGS. 4A to 4D are schematic diagrams illustrating changes in a magnetization angle between the pinned magnetic layer 18 and the free magnetic layer 20 in the case where an external magnetic field operates on a GMR element. FIGS. 4A to 4D schematically illustrate the layered structure of the pinned magnetic layer 18, the nonmagnetic layer 19, and the free magnetic layer 20, and illustrate changes in a magnetization direction D2 in the free magnetic layer 20 caused by an external magnetic field M1 in a state in which the magnetization direction D1 in the pinned magnetic layer 18 of a GMR element is pinned in one direction.

Figure 4A:
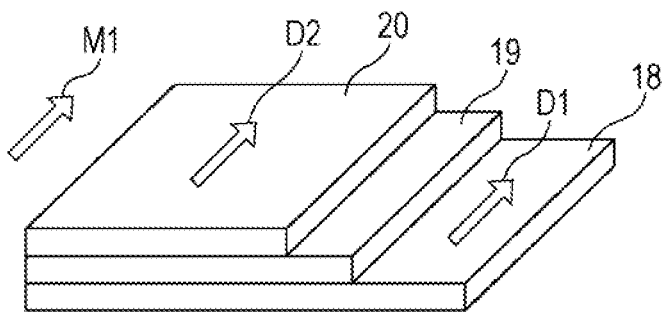
FIGS. 4A to 4D are schematic diagrams illustrating changes in a magnetization angle between a pinned magnetic layer and a free magnetic layer in the case where an external magnetic field operates on a GMR element, in the current measurement apparatus according to the first embodiment of the present invention.
Figure 4B:
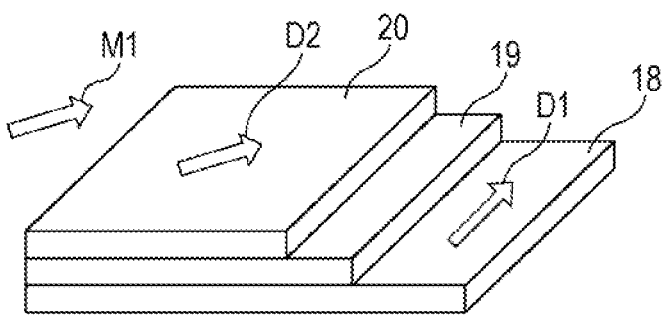
Figure 4C:
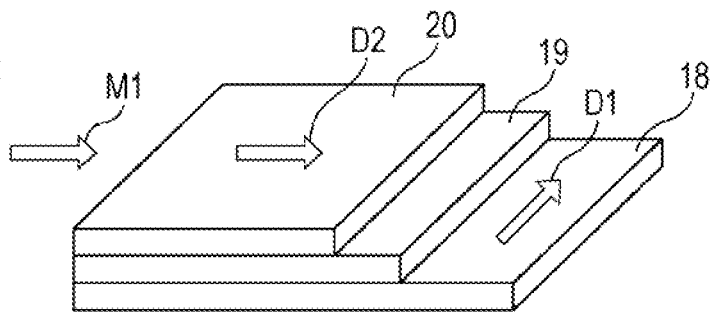
Figure 4D:
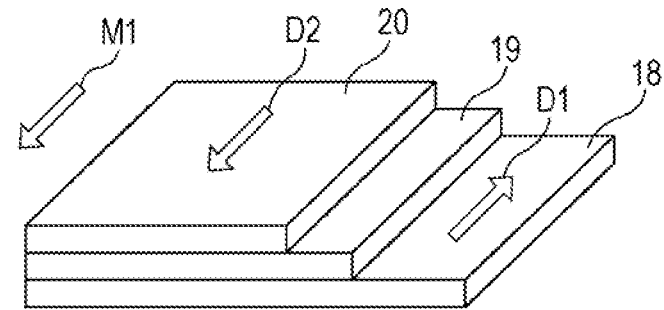

As illustrated in FIG. 4A, when the external magnetic field M1 operates parallel to the magnetization direction D1 in the pinned magnetic layer 18, the magnetization direction D2 in the free magnetic layer 20 becomes parallel to the magnetization direction D1 in the pinned magnetic layer 18, resulting in a magnetization angle of 0°. As illustrated in FIGS. 4B and 4C, as an angle at which the external magnetic field M1 operates becomes larger with respect to the magnetization direction D1 in the pinned magnetic layer 18, a change in the magnetization direction D2 in the free magnetic layer 20 is increased, resulting in a larger magnetization angle. As illustrated in FIG. 4D, when the external magnetic field M1 operates in the opposite direction (180°) with respect to the magnetization direction D1 in the pinned magnetic layer 18, the magnetization direction D2 in the free magnetic layer 20 becomes to be oriented in the direction opposite to the magnetization direction D1 in the pinned magnetic layer 18, resulting in the maximum magnetization angle.

Figure 5:
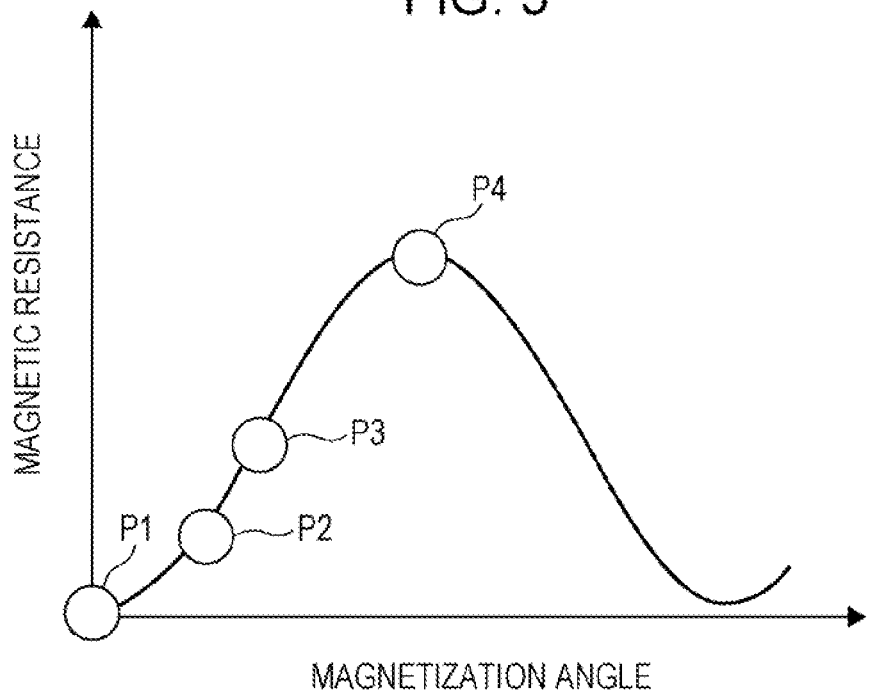
FIG. 5 is a diagram illustrating a correlation between a magnetization angle and a magnetic resistance according to the first embodiment of the present invention.

FIG. 5 is a diagram illustrating a correlation between a magnetization angle and a magnetic resistance. Point P1 illustrated in FIG. 5 represents a magnetic resistance corresponding to the magnetization angle illustrated in FIG. 4A; point P2 represents a magnetic resistance corresponding to the magnetization angle illustrated in FIG. 4B; point P3 represents a magnetic resistance corresponding to the magnetization angle illustrated in FIG. 4C; and point P4 represents a magnetic resistance corresponding to the magnetization angle illustrated in FIG. 4D. As indicated by point P1, the magnetic resistance is the minimum when the magnetization angle is 0°. As indicated by points P2 and P3, as the magnetization angle becomes larger, the magnetic resistance is increased. As indicated by point P4, the magnetic resistance is the maximum when the magnetization angle is 180°.

Thus, the magnetic resistance of each of the GMR elements 12-1 to 12-N is changed in accordance with its magnetization angle. Accordingly, the magnetization direction D1 in the pinned magnetic layer 18 is made be oriented in any direction, and a change in magnetic resistance is measured, whereby the magnitude of the external magnetic field M1 can be measured. In addition, the external magnetic field M1 is changed depending on the magnitude of the current which is to be detected and which flows through the conductor 13. Accordingly, by summing the magnetic resistances of the GMR elements 12-1 to 12-N, the magnitude of the current which is to be detected and which flows through the conductor 13 can be measured. The magnetic resistance of each of the GMR elements 12-1 to 12-N can be calculated from the relational expression (1) described below.

$$R = Rmin + \Delta Rm/2[1 - \cos(\theta f - \theta p)] \quad \text{Expression (1)}$$

(In Expression (1), Rmin represents a magnetic resistance obtained when the magnetization angle is equal to 0, ΔRm represents a magnetic resistance, θf represents an angle of the magnetization direction in the free magnetic layer 20, and θp represents an angle of the magnetization direction in the pinned magnetic layer 18.)

Figure 6:
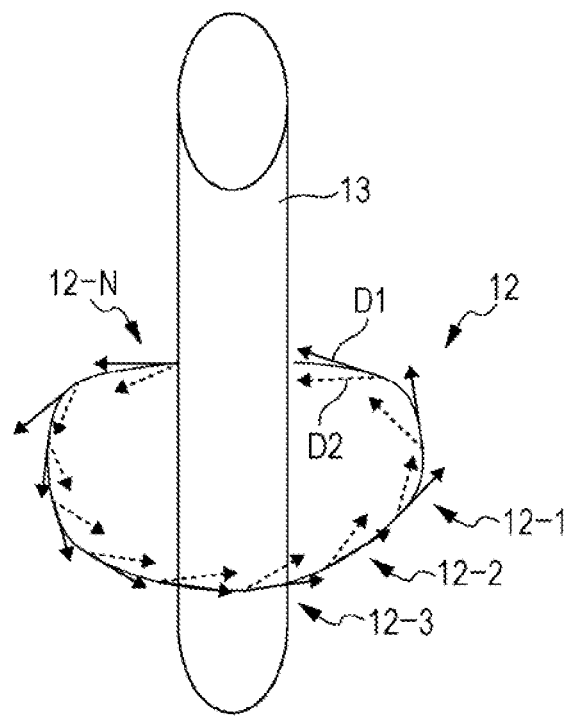
FIG. 6 is a conceptual diagram illustrating changes in the magnetization angles of the GMR elements in the current measurement apparatus according to the first embodiment of the present invention.

FIG. 6 is a conceptual diagram illustrating changes in the magnetization angles of the GMR elements 12-1 to 12-N in the current measurement apparatus 1. In FIG. 6, the GMR element line 12 is represented by a ring-shaped curve, the magnetization direction D1 in the pinned magnetic layer 18 is represented by a solid-line arrow, and the magnetization direction D2 in the free magnetic layer 20 is represented by a dotted-line arrow. As illustrated in FIG. 6, in the case where a current to be detected flows through the conductor 13 to cause a magnetic field to occur around the conductor 13, the magnetization direction D2 in the free magnetic layer 20 is changed to the conductor 13 side with respect to the magnetization direction D1 in the pinned magnetic layer 18 in each of the GMR elements 12-1 to 12-N located at the positions on the curve, resulting in an increase in the magnetization angle.

As illustrated in FIG. 6, in the current measurement apparatus 1, the GMR elements 12-1 to 12-N disposed in ring shape around the conductor 13 may be regarded as a ring-shaped closed path formed by the GMR elements 12-1 to 12-N around the conductor 13. In addition, as described above, the current measurement apparatus 1 can detect a magnetic field that occurs when a current to be detected flows through the conductor 13, via changes in the magnetic resistances of the GMR elements 12-1 to 12-N. Thus, by summing changes in the resistance values of the GMR elements 12-1 to 12-N according to Ampere's law, the magnitude of the current which is to be detected and which flows through the conductor 13 may be calculated.

A concrete example of the arithmetic processing will be described. According to the embodiment, a change in the resistance value of the GMR elements 12-1 to 12-N is calculated according to the relational expression (2) described below. The relational expression (2) described below indicates that the magnitude of a current flowing through the conductor 13 is calculated by integrating the magnetic field strengths detected in the GMR elements 12-1 to 12-N. In addition, the relational expressions (3) and (4) described below can be derived from the relational expression (2) described below. The relational expression (3) described below indicates that a current flowing through the conductor 13 can be detected by summing the magnetic field strengths detected in the GMR elements 12-1 to 12-N. Further, the relational expression (4) described below indicates that the magnitude of a current flowing through the conductor 13 is detected through changes in the magnetization directions in the free magnetic layers 20 of the GMR elements 12-1 to 12-N.

$$I = \int \vec{H} d\vec{s} \quad \text{Expression (2)}$$

$$I = Lim(\Sigma(\vec{H}nd\vec{s}n)) \approx (\vec{H1}d\vec{s1}) + (\vec{H2}d\vec{s2}) + \ldots + (\vec{HN}d\vec{sN}) \quad \text{Expression (3)}$$

$$I = Lim \approx |H1| + |ds1| \times \cos\theta 1 + |H1| + |ds1| \times \cos\theta 2 + \ldots |HNdsN| \quad \text{Expression (4)}$$

(In Expressions (2) to (4), H represents a magnetic field vector.)

Figure 7A:
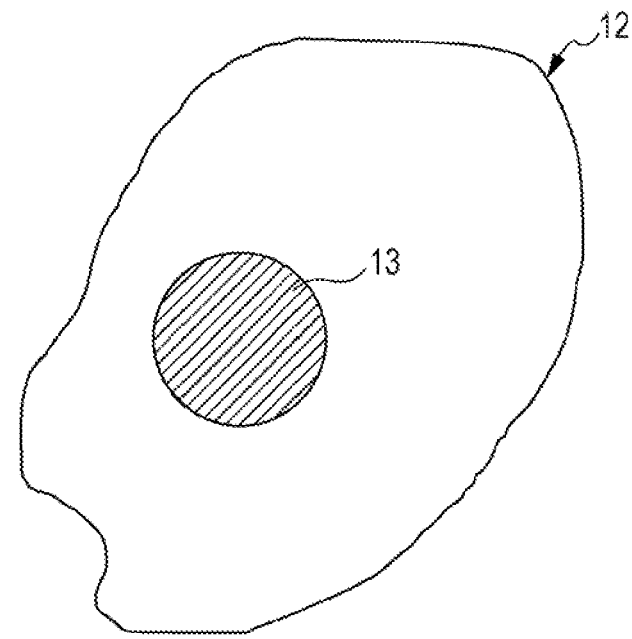
FIGS. 7A and 7B are diagrams illustrating exemplary configurations of the GMR elements in the current measurement apparatus according to the first embodiment of the present invention.
Figure 7B:
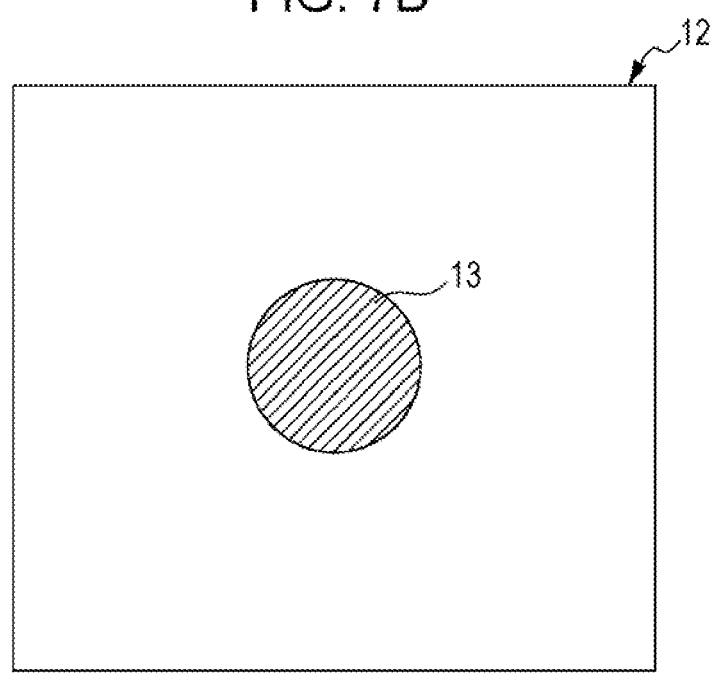

The GMR element line 12 is not necessarily disposed in ring shape, and the shape of the GMR element line 12 is not particularly limited as long as the GMR element line 12 is disposed so as to surround the conductor 13 (not necessarily surround the conductor 13 completely). For example, as illustrated in FIG. 7A, even in the case where the GMR element line 12 is disposed in a ring shape that is asymmetrical (including a distorted shape) around the conductor 13 and/or the conductor 13 is not located at the center of the GMR element line 12, a closed path is formed by the GMR element line 12 around the conductor 13, enabling a current which is to be detected and which flows through the conductor 13 to be measured. As illustrated in FIG. 7B, the GMR element line 12 may be disposed in a rectangular shape in plan view.

The magnetization direction D1 in the pinned magnetic layer 18 is desirably pinned in the same direction, for example, when viewed from the extension direction of the conductor 13 at each of the positions of the GMR elements 12-1 to 12-N. Thus, by pinning the magnetization direction D1, a magnetic field caused by a current that is to be detected and that flows through the conductor 13 causes the magnetization directions in the free magnetic layers 20 to be changed to substantially the same direction with respect to the magnetizations direction in the pinned magnetic layers 18. Accordingly, variations in the changes in the magnetization angles of the individual GMR elements 12-1 to 12-N with respect to the center of the conductor 13 can be reduced, and the detectivity difference for the current to be detected can be reduced.

The detection operation performed by the current measurement apparatus 1 having a configuration as described above will be described. When a current which flows through the conductor 13 is to be detected, a voltage is applied to the terminal 26 of the calculation unit 21 illustrated in FIG. 3. In this state, the current which is to be detected and which flows through the conductor 13 causes a magnetic field to occur around the conductor 13. The magnetization directions in the free magnetic layers 20 of the GMR elements 12-1 to 12-N are each changed in accordance with this magnetic field, resulting in changes in the magnetic resistances of the GMR elements 12-1 to 12-N. Since the GMR elements 12-1 to 12-N are electrically connected in series, a magnetic resistance for the GMR element line 12 as a whole constituted by the GMR elements 12-1 to 12-N is regarded as a resistance value of the variable resistor 22. Thus, a magnetic resistance for the GMR element line 12 as a whole is regarded as a resistance value of the variable resistor 22, and the voltage detected on the side of the fixed resistors 24 and 25 of the bridge circuit and the voltage detected on the side of the variable resistor 22 and the fixed resistor 23 are changed to generate a voltage difference. This voltage difference is detected by the detection unit 27, whereby the magnitude of the current to be detected can be measured.

Thus, according to the embodiment, the multiple GMR elements 12-1 to 12-N are disposed in ring shape around the conductor 13, and the GMR elements 12-1 to 12-N are connected so as to form the series variable resistor 22, whereby the magnitude of a current to be detected can be measured via changes in the magnetic resistances, each of which is based on a change in the magnetization angle between the magnetization direction in the pinned magnetic layer 18 and that in the free magnetic layer 20. Accordingly, the outputs of the GMR elements 12-1 to 12-N can be summed without an adding circuit or the like, achieving a highly sensitive current measurement apparatus. According to the embodiment, since the element configuration is based on Ampere's law, even when the positions (distances) of the multiple GMR elements 12-1 to 12-N disposed in ring shape with respect to the conductor 13 vary to some degree, the magnitude of a measurement current can be correctly measured.

Figure 8A:
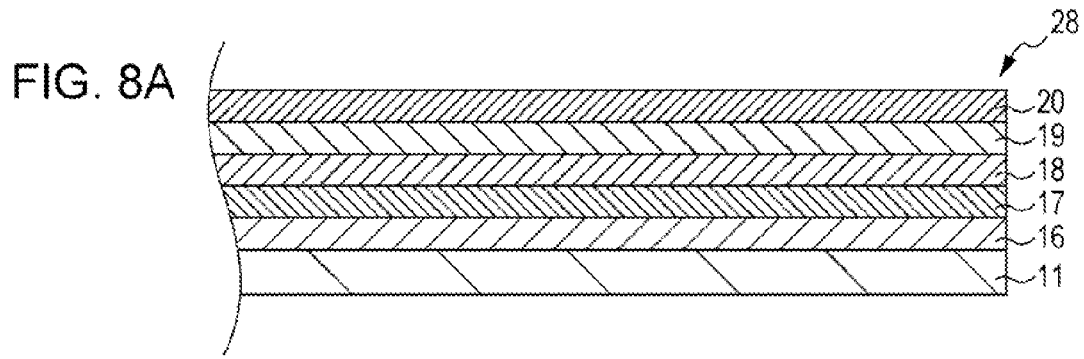
FIGS. 8A to 8D are diagrams for explaining the method for manufacturing the GMR elements in the current measurement apparatus according to the first embodiment of the present invention.

Referring to FIGS. 8A to 8D, the method for manufacturing the GMR elements 12-1 to 12-N will be described. FIGS. 8A to 8D are local sectional views illustrating manufacturing processes for the GMR elements 12-1 to 12-N. In FIG. 8A, the seed layer 16, the antiferromagnetic layer 17, the pinned magnetic layer 18, the nonmagnetic layer 19, and the free magnetic layer 20 are stacked on top of one another in this sequence by, for example, sputtering on the entire surface of the substrate 11 to form a multilayer body 28. Then, a resist layer (not illustrated) is formed on the free magnetic layer 20, and a pattern in the resist layer is formed in portions in which the GMR elements 12-1 to 12-N are to be formed. The pattern formation in the resist layer is performed by exposure and development.

Figure 8B:
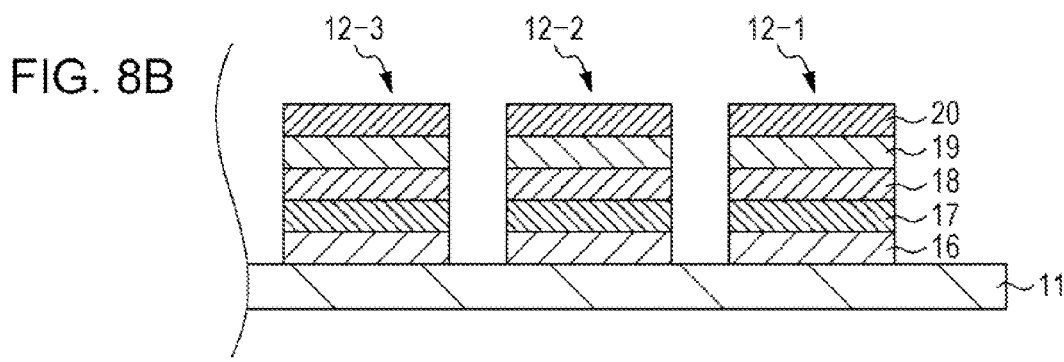
Figure 8C:
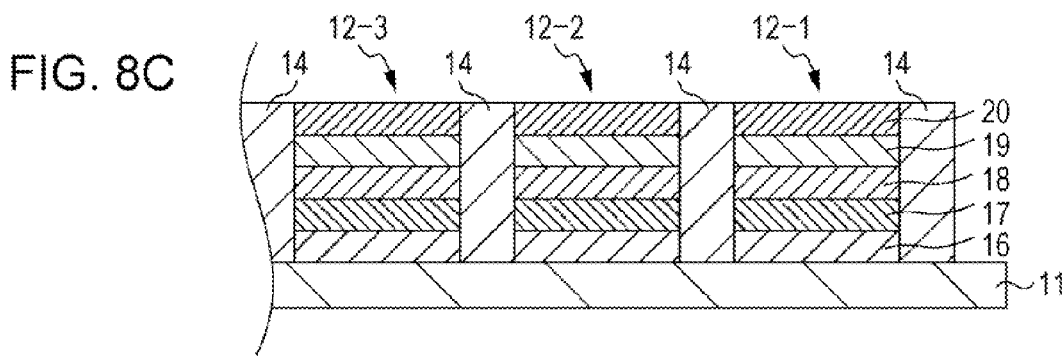

In FIG. 8B, portions of the multilayer body 28 which are not covered by the resist layer are removed by dry etching such as ion milling. In FIG. 8C, the conductive bodies 14 are formed by, for example, sputtering, and the resist layer is removed. Through the above-described processes, the GMR elements 12-1 to 12-N are formed.

The pinning of the magnetization direction in the pinned magnetic layer 18 of each of the GMR elements 12-1 to 12-N will be described. The pinning of the magnetization direction in the pinned magnetic layer 18 is performed by means of annealing treatment in a magnetic field after the multilayer body 28 is formed. In the annealing treatment, an exchange coupling magnetic field occurs between the antiferromagnetic layer 17 and the pinned magnetic layer 18, and the magnetization direction in the pinned magnetic layer 18 is pinned. The magnetization direction in the free magnetic layer 20 is oriented in the same direction as that in the pinned magnetic layer 18 under the influence of the magnetization direction in the pinned magnetic layer 18 in the state in which no external magnetic fields operate. In addition, no exchange coupling magnetic fields occur between the free magnetic layer 20 and the antiferromagnetic layer 17, and the free magnetic layer 20 is stacked on the pinned magnetic layer 18 with the nonmagnetic layer 19 interposed therebetween, allowing the magnetization direction of the free magnetic layer 20 to be easily changed. Note that the annealing treatment may be performed in at least any one of the processes illustrated in FIGS. 8A to 8C.

According to the embodiment, as illustrated in FIG. 1, to pin the magnetization directions in the pinned magnetic layers 18 in the ring-shaped direction, after the element structures of the GMR elements 12-1 to 12-N are formed, a wire for generating a magnetic field is provided at the same position as that of the conductor 13, and the annealing treatment is performed while the wire for generating a magnetic field is energized. Thus, by performing the annealing treatment while the wire for generating a magnetic field is energized, a current flows so that a magnetic field oriented in the ring-shaped direction along the GMR elements 12-1 to 12-N disposed in ring shape is formed. Accordingly, the magnetization direction of the pinned magnetic layer 18 can be pinned in the direction oriented along the magnetic field generated by the energization of the wire for generating a magnetic field. The temperature used in the annealing treatment is, for example, approximately 270° C. The magnetization directions in the GMR elements 12-1 to 12-N may be pinned using a solenoid coil with which the GMR element line 12 disposed in ring shape is wound. In this case, for example, while a solenoid coil having a winding number of 10000 turns/m is energized with a current of 1 A, the annealing treatment is performed at a temperature of 270° C. for 1.5 hours, so that the magnetization direction in the pinned magnetic layer 18 is pinned.

In the layered structure of the GMR elements 12-1 to 12-N, at least the free magnetic layers 20 of the GMR elements 12-1 to 12-N may be disposed so as to be separated from each other at the positions between the GMR elements 12-1 to 12-N. For example, the layered structure illustrated in FIG. 8D may be employed. In the example illustrated in FIG. 8D, the seed layer 16, the antiferromagnetic layer 17, the pinned magnetic layer 18, and the nonmagnetic layer 19 are shared as single layers by the GMR elements 12-1, 12-2, and 12-3 that are adjacent to each other, whereas the free magnetic layers 20 corresponding to the GMR elements 12-1, 12-2, and 12-3 which are adjacent to each other are stacked so as to be separated from each other. By forming the GMR elements 12-1 to 12-N in this way, the GMR elements 12-1 to 12-N can be electrically connected in series without forming the conductive bodies 14.

Figure 8D:
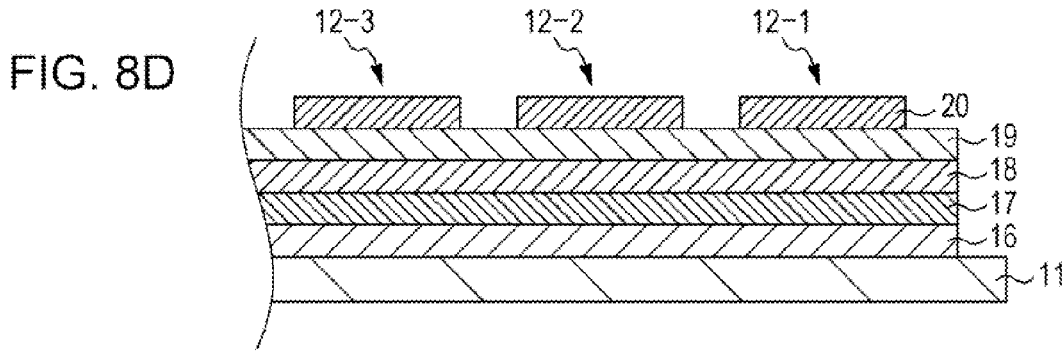

The GMR elements 12-1 to 12-N illustrated in FIG. 8D are manufactured as described below. First, the seed layer 16, the antiferromagnetic layer 17, the pinned magnetic layer 18, and the nonmagnetic layer 19 are stacked on top of one another in this sequence on the substrate 11. Then, a resist layer (not illustrated) is formed on the nonmagnetic layer 19, and pattern formation is performed in portions in which the free magnetic layers 20 are to be formed (portions in which the GMR elements 12-1, 12-2, and 12-3 are to be formed) by exposure and development. Then, the free magnetic layers 20 are formed and the resist layer is removed, whereby the GMR elements 12-1 to 12-N illustrated in FIG. 8D can be manufactured. By manufacturing the GMR elements 12-1 to 12-N in this way, the manufacturing process for the GMR elements 12-1 to 12-N can be simplified.

Second Embodiment

Figure 9:
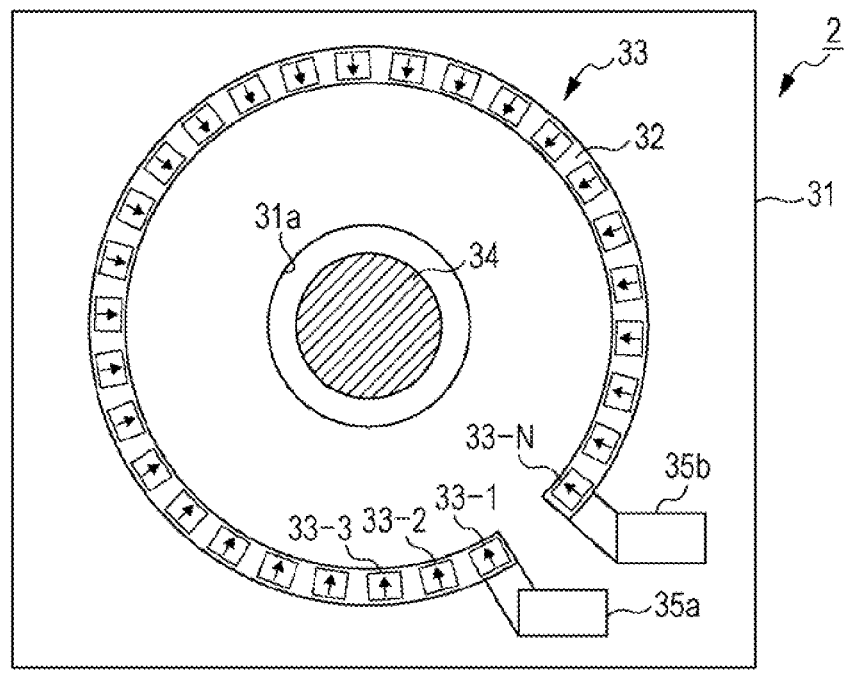
FIG. 9 is a plan view illustrating a current measurement apparatus according to a second embodiment of the present invention.

A second embodiment of the present invention will be described. FIG. 9 is a plan view illustrating a current measurement apparatus according to the second embodiment of the present invention. In the description below, differences from the current measurement apparatus 1 illustrated in FIG. 1 will be mainly described.

As illustrated in FIG. 9, a current measurement apparatus 2 according to the embodiment includes a substrate 31 having a substantially circular-shaped center aperture 31a, a conductive layer 32 formed in ring shape in an outer periphery of the center aperture 31a of the substrate 31, and multiple GMR elements 33-1 to 33-N disposed separately from each other on the conductive layer 32. A conductor 34 through which a current to be detected flows is disposed so as to pass through the center aperture 31a of the substrate 31. The GMR element 33-1 located on one end side of the GMR elements 33-1 to 33-N is connected to an electrode pad 35a, whereas the GMR element 33-N located on the other end side is connected to an electrode pad 35*b*. Thus, according to the embodiment, the GMR elements 33-1 to 33-N are disposed in ring shape around the conductor 34, and are electrically connected in series via the common conductive layer 32, forming a GMR element line 33.

According to the embodiment, in the GMR elements 33-1 to 33-N, the magnetization direction in the pinned magnetic layer is pinned toward the conductor 34 side (center portion) (see the arrows in FIG. 9). By pinning the magnetization direction in the pinned magnetic layer in this way, a magnetic field which occurs around the conductor 34 when a current flows through the conductor 34 is orthogonal to the magnetization direction in the pinned magnetic layer. Accordingly, the magnetization angle in the free magnetic layer can be larger, improving the detectivity. The magnetization directions in the pinned magnetic layers of the GMR elements 33-1 to 33-N may be pinned in the radial directions from the center portion of the conductor 34.

Figure 10A:
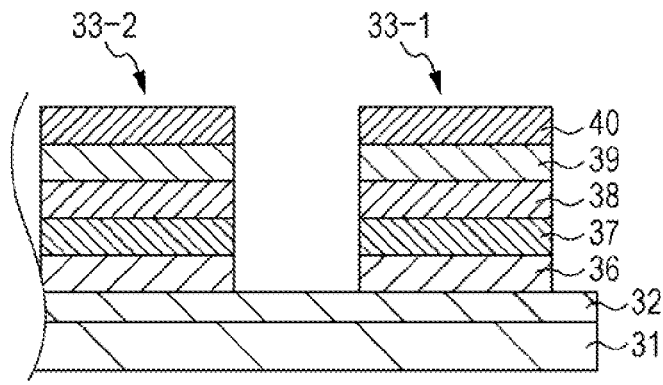
FIGS. 10A and 10B are diagrams illustrating the layered structure of GMR elements in the current measurement apparatus according to the second embodiment of the present invention.

The layered structure of the GMR elements 33-1 to 33-N of the current measurement apparatus 2 will be described with reference to FIG. 10A. FIG. 10A illustrates a portion of the layered structure for some of the GMR elements, the GMR elements 33-1 and 33-2. As illustrated in FIG. 10A, the GMR elements 33-1 and 33-2 include the conductive layer 32 provided on the substrate 31. The GMR elements 33-1 and 33-2 each include a seed layer 36 provided on the conductive layer 32, an antiferromagnetic layer 37 provided on the seed layer 36, a pinned magnetic layer 38 provided on the antiferromagnetic layer 37, a nonmagnetic layer 39 provided on the pinned magnetic layer 38, and a free magnetic layer 40 provided on the nonmagnetic layer 39. In addition, the corresponding layers, other than the conductive layer 32, of the GMR elements 33-1 and 33-2 are disposed separately from each other, and are electrically connected via the conductive layer 32. A ground layer may be provided between the conductive layer 32 and the seed layers 36. Protective layers may be provided on the free magnetic layers 40. As illustrated in FIG. 8D, in the layered structure of the GMR elements 33-1 to 33-N, only the free magnetic layers 40 may be separated from each other at the positions between the GMR elements 33-1 to 33-N.

Figure 10B:
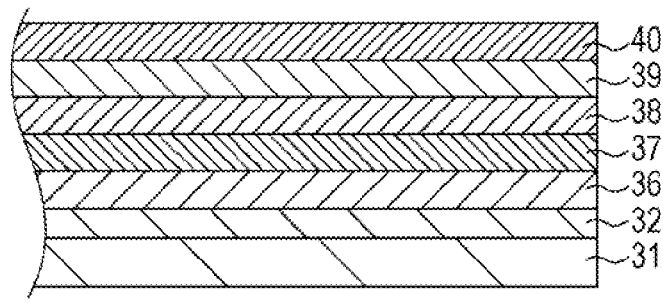

The method for manufacturing the GMR elements 33-1 to 33-N will be described. In FIG. 10B, the conductive layer 32, the seed layer 36, the antiferromagnetic layer 37, the pinned magnetic layer 38, the nonmagnetic layer 39, and the free magnetic layer 40 are stacked on top of one another in this sequence on the entire surface of the substrate 31. Then, a resist layer (not illustrated) is formed on the free magnetic layer 40, and a pattern formation in the resist layer is performed by exposure and development in portions in which the GMR elements 33-1 to 33-N are to be formed. Then, portions of the seed layer 36, the antiferromagnetic layer 37, the pinned magnetic layer 38, the nonmagnetic layer 39, and the free magnetic layer 40 are removed by etching, and the resist layer is removed, whereby the GMR elements 33-1 to 33-N are manufactured.

Figure 11A:
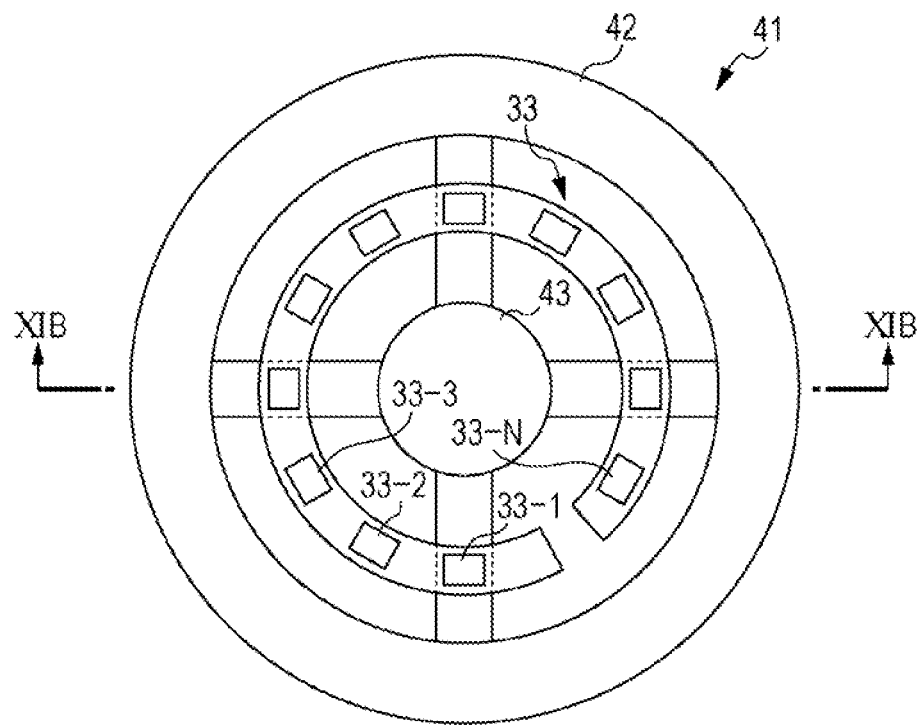
FIG. 11A is a schematic diagram illustrating an exemplary application of a magnetic field in a deposition process of the current measurement apparatus according to the second embodiment of the present invention.
Figure 11B:
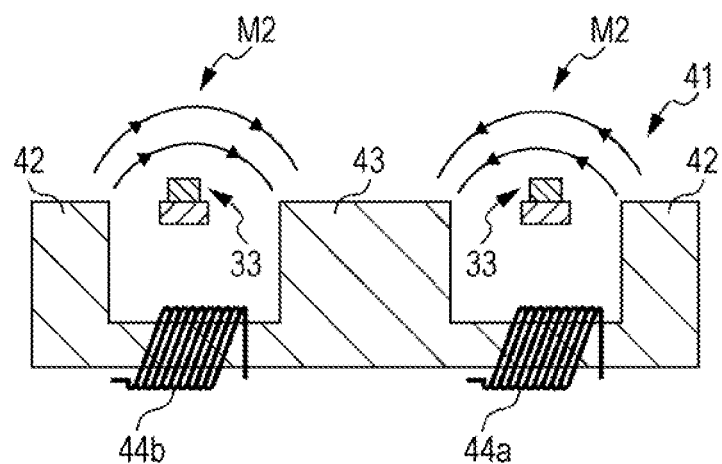
FIG. 11B is a section view taken along line XIB-XIB of FIG. 11A.

According to the embodiment, the pinned magnetic layer 38 is formed while a magnetic field is applied, whereby the magnetization direction in the pinned magnetic layer 38 is pinned in a direction toward the conductor 34 side. FIG. 11A is a schematic diagram illustrating an exemplary application of a magnetic field in the deposition process, and FIG. 11B is a section view taken along line XIB-XIB of FIG. 11A. As illustrated in FIG. 11A, in the deposition process, while a magnetic field is applied using, for example, an electromagnet 41, the magnetization directions in the pinned magnetic layers 38 of GMR elements 33-1 to 33-N are pinned. The electromagnet 41 includes a ring-shaped external electrode 42 (for example, the north pole) provided on the rim side of the GMR element line 33 that is formed in ring shape, and an internal electrode 43 (for example, the south pole) provided in the inside of the GMR element line 33. As illustrated in FIG. 11B, coils 44*a* and 44*b* are provided on the lower surface side of the GMR element line 33, and a current is passed through the coils 44*a* and 44*b*, whereby a magnetic field M2 occurs between the external electrode 42 and the internal electrode 43 so as to pass across the GMR element line 33. Thus, while the magnetic field M2 is applied by using the electromagnet 41, the GMR elements 33-1 to 33-N are formed in the magnetic field, enabling the magnetization direction in the pinned magnetic layers 38 to be oriented toward the conductor 34 side.

Figure 12:
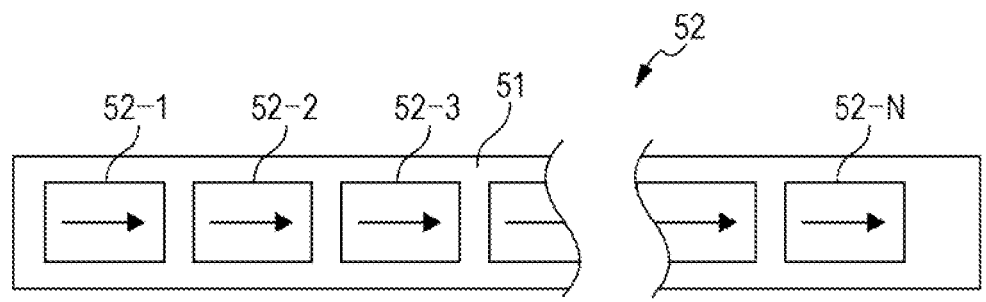
FIG. 12 is a diagram illustrating another exemplary configuration of the GMR elements of the current measurement apparatus according to an embodiment of the present invention.

In the embodiments described above, an embodiment in which the GMR elements are disposed on the substrate is described. However, the GMR elements may be disposed on a body other than a substrate so as to be used. FIG. 12 is a diagram illustrating another exemplary configuration of the GMR elements. In the example illustrated in FIG. 12, multiple GMR elements 52-1 to 52-N are disposed in line on a rectangular-shaped elastic body 51, forming a GMR element line 52. Thus, by forming the multiple GMR elements 52-1 to 52-N in line, the magnetization directions in the pinned magnetic layers can be pinned in one direction, and the GMR elements 52-1 to 52-N can be easily manufactured.

Figure 13:
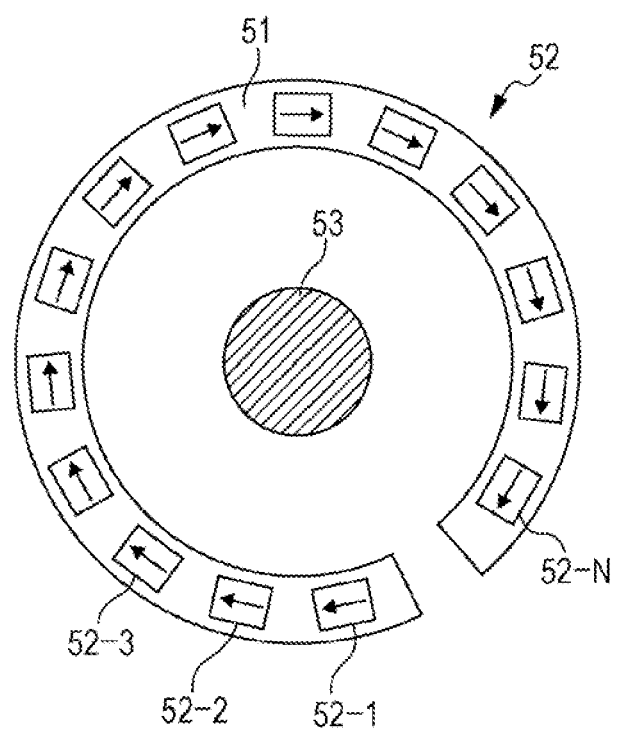
FIG. 13 is a diagram illustrating another exemplary configuration of the current measurement apparatus according to an embodiment of the present invention.

A current measurement apparatus using the GMR elements 52-1 to 52-N disposed on the elastic body 51 illustrated in FIG. 12 will be described with reference to FIG. 13. FIG. 13 is a diagram illustrating another exemplary configuration of the current measurement apparatus according to the embodiment. As illustrated in FIG. 13, in the example, the elastic body 51 is deformed and disposed so as to surround a conductor 53, enabling the GMR elements 52-1 to 52-N to be disposed in ring shape as in the current measurement apparatuses 1 and 2 described above. Thus, the GMR elements 52-1 to 52-N in which the magnetization directions in the pinned magnetic layers that are manufactured in a uniform magnetic field are pinned in one direction can be used, allowing the current measurement apparatus to be easily manufactured. The GMR elements 52-1 to 52-N may be electrically connected by providing conductive bodies, or may be electrically connected using a conductive elastic body.

Figure 14:
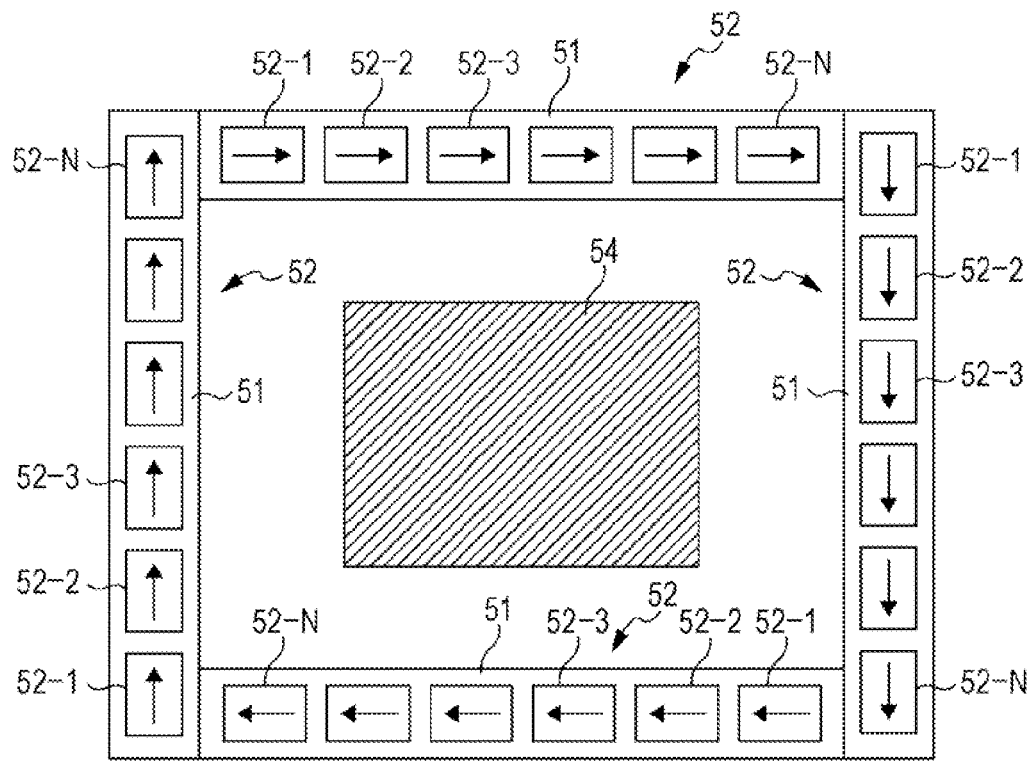
FIG. 14 is a diagram illustrating yet another exemplary configuration of the current measurement apparatus according to an embodiment of the present invention.

FIG. 14 is a diagram illustrating yet another exemplary configuration of the current measurement apparatus according to the embodiment. As illustrated in FIG. 14, in the example, four elastic bodies 51 are disposed around a conductor 54 having a rectangular shape in section, forming a current measurement apparatus. The GMR elements 52-1 to 52-N aligned in line on each of the elastic bodies 51 are disposed around the conductor 54 so as to correspond to the sides of the conductor 54. Such an arrangement allows the GMR elements 52-1 to 52-N in which the magnetization directions in the pinned magnetic layers that are manufactured in a uniform magnetic field are pinned in one direction to be used, and allows the current measurement apparatus to be easily formed.

The material of the elastic body 51 is not limited as long as it allows the GMR elements 52-1 to 52-N to be electrically connected to each other and can be deformed elastically, and polyimide or the like may be used.

Figure 15:
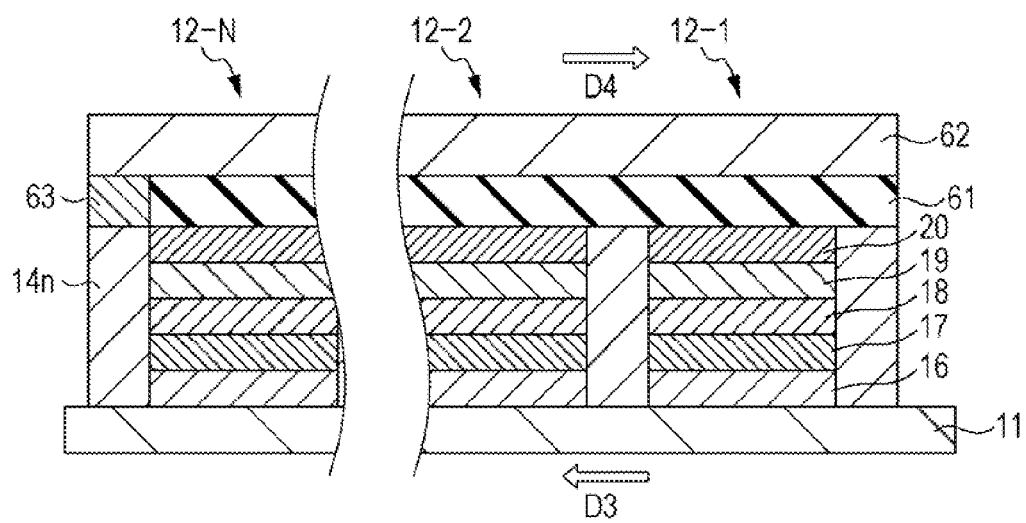
FIG. 15 is a diagram illustrating another layered structure of the GMR elements in the current measurement apparatus according to an embodiment of the present invention.

FIG. 15 is a diagram illustrating another layered structure of the GMR elements 12-1 to 12-N in the current measurement apparatus 1 illustrated in FIG. 1. In the example, in addition to the layered structure of the GMR elements 12-1 to 12-N illustrated in FIG. 2, a conductive layer 62 is provided on the free magnetic layers 20 with an insulating layer 61 interposed therebetween. The conductive layer 62 is electrically connected to the layers of the GMR element 12-N via a conductive body 14n and a conductive layer 63 which are located on the other side of the GMR element line 12. Such a multilayer structure causes a current which has flowed in the D3 direction through the layers of the GMR elements 12-1 to 12-N to flow in the D4 direction through the conductive layer 62.

According to the embodiment, a current flowing in the D3 direction through the GMR elements 12-1 to 12-N causes a magnetic field. This magnetic field causes the magnetization directions in the free magnetic layers 20 to be changed. In the example, the conductive layer 62 is provided so that the current which has flowed through the GMR elements 12-1 to 12-N flows in the D4 direction which is opposite to the D3 direction to generate a magnetic field which is oriented in the opposite direction. Thus, the magnetic field caused by the current flowing in the D3 direction cancels the magnetic field caused by the current flowing in the D4 direction, whereby a change in the magnetization direction in a free magnetic layer 20 can be reduced, achieving a current measurement apparatus having a high detectivity.

Figure 16A:
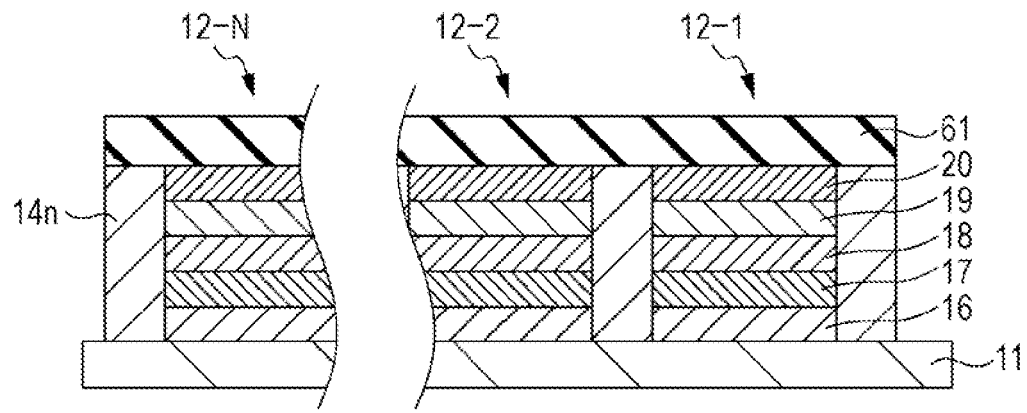
FIGS. 16A to 16C are diagrams for explaining the method for manufacturing the GMR elements in the current measurement apparatus according to an embodiment of the present invention.
Figure 16B:
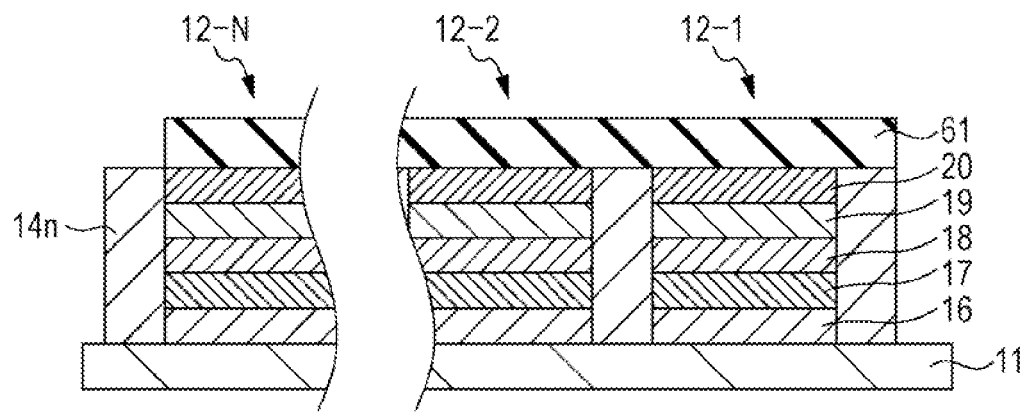
Figure 16C:
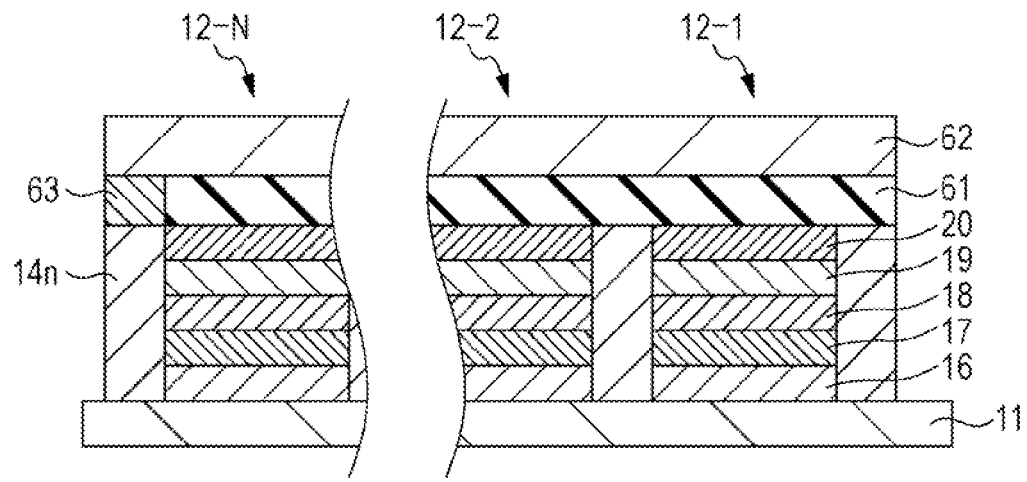

The method for manufacturing the GMR elements 12-1 to 12-N illustrated in FIG. 15 will be described with reference to FIGS. 16A to 16C. In FIG. 16A, the insulating layer 61 is formed on the entire surface for the GMR elements 12-1 to 12-N (including the conductive bodies 14 and 14n) by, for example, sputtering. Then, a resist layer (not illustrated) is formed on the insulating layer 61, and a portion of the resist layer which is located on the conductive body 14n on the other side of the GMR element line 12 is removed through pattern formation. In FIG. 16B, a portion of the insulating layer 61 which is located on the conductive body 14n is removed by, for example, dry etching. In FIG. 16C, the conductive layer 62 on the insulating layer 61 as well as the conductive layer 63 on the conductive body 14n is formed by, for example, sputtering, whereby the GMR elements 12-1 to 12-N are manufactured.

In the embodiments, an embodiment using GMR elements is described. However, the way of measuring a current to be detected is not particularly limited to this as long as the measurement is made by using magnetoresistive effect elements. For example, magnetoresistive (MR) elements or tunneling magnetoresistive (TMR) elements may be used. Among the above-described elements, it is preferable that GMR elements, TMR elements, or the like which have a high magnetic-field sensitivity for a desired direction and which have a low magnetic-field sensitivity for the directions other than that to be detected be used. In addition, it is preferable that, as the GMR elements, spin-valve GMR elements or the like which each have multilayer films including an antiferromagnetic layer, a pinned magnetic layer, a nonmagnetic layer, and a free magnetic layer be used.

As described above, according to the embodiments, the GMR elements are disposed in ring shape around the conductor, and a magnetic resistance of each of the GMR elements is detected, enabling the magnitude of a current which is to be detected and which flows through the conductor to be measured. In particular, according to the embodiment, the magnetization direction in the pinned magnetic layer of a GMR element is pinned in a predetermined direction in accordance with the magnitude of the current to be detected, whereby the magnetization angle between the magnetization direction in the pinned magnetic layer and that in the free magnetic layer can be adjusted, enabling the detectivity to be adjusted. In addition, a wide range of a change in the magnetic field can be detected by using the GMR elements. Accordingly, the detection range of the current measurement apparatus can be enlarged. Further, a high detectivity can be obtained for the direction orthogonal to the orientation of the magnetic field by using the GMR elements, achieving a reduction in the size of the current measurement apparatus compared with one using Hall elements.

The GMR elements can be directly formed on the substrate by, for example, sputtering, enabling the current measurement apparatus to be easily manufactured. In addition, a conductor layer is formed on the upper surfaces of the free magnetic layers in the GMR elements, and a current flows through the conductor layer in the opposite direction, whereby a magnetic field in the opposite direction can cancel a magnetic field that occurs due to the energization of the seed layers, improving the detectivity.

The present invention is not limited to the above-described embodiments, and various modifications may be made and embodied. In addition, for example, the materials, and the arrangement positions, the thickness, the size, and the manufacturing method of magnetoresistive effect elements may be changed and embodied as appropriate. Other than that, the present invention may be modified and embodied as appropriate without departing from the scope of the present invention.

The present invention can be applied to, for example, a current measurement apparatus for detecting a value of a current for driving a motor of an electric car, or a current value of a solar battery.

What is claimed is:

1. A current measurement apparatus for detecting a current flowing through a conductor, the current measurement apparatus comprising:
   a series of magnetoresistive effect elements electrically connected to one another in series so as to form a variable resistor, the series of the magnetoresistive effect elements being disposed in a ring shape around the conductor and, each of the magnetoresistive effect elements including:
      a pinned magnetic layer having a pinned magnetization direction; and
      a free magnetic layer having a magnetization direction to be changed by an external magnetic field applied thereto; and
   a calculation section configured to obtain a magnitude of the current based on an output of the variable resistor formed of the series of magnetoresistive effect elements,
   wherein the pinned magnetization direction of the pinned magnetic layer in each of the magnetoresistive effect elements is pinned in a same direction with respect to an extension direction of the conductor when viewed from a respective position of each of the magnetoresistive effect elements.

2. The current measurement apparatus according to claim 1, wherein, in each of the magnetoresistive effect elements, the pinned magnetization direction of the pinned magnetic layer is pinned along a ring-shaped direction in which the magnetoresistive effect elements are connected in series.

3. The current measurement apparatus according to claim 1,
   wherein, in each of the magnetoresistive effect elements, the pinned magnetization direction of the pinned magnetic layer is pinned in a direction toward a center line of the conductor.

4. The current measurement apparatus according to claim 1,
wherein, in each of the magnetoresistive effect elements, the pinned magnetization direction of the pinned magnetic layer is pinned in a radial direction from a center line of the conductor.

5. The current measurement apparatus according to claim 1,
wherein the series of magnetoresistive effect elements is provided on a common conductive body.

6. The current measurement apparatus according to claim 1,
wherein the series of magnetoresistive effect elements is formed on an elastic body, and the elastic body is disposed around the conductor in a deformed state.

7. The current measurement apparatus according to claim 1, further comprising:
a conductive layer disposed over the free magnetic layers of the series of magnetoresistive effect elements with an insulating layer interposed therebetween, the conductive layer allowing a current to return by flowing therethrough in an opposite direction after the current flows through the series of magnetoresistive effect elements and reaches an end thereof.

8. The current measurement apparatus according to claim 7, wherein a magnetic field caused by the current flowing in the opposite direction and a magnetic field caused by the current flowing through the series of magnetoresistive effect elements cancel each other, thereby increasing sensitivity of the current measurement apparatus.

9. The current measurement apparatus according to claim 1, wherein the calculation section includes three fixed resistors and wherein the variable resistor formed of the series of the magnetoresistive elements electrically connected to said three fixed resistors.

\* \* \* \* \*